United States Patent
Takeda et al.

(10) Patent No.: US 9,570,312 B2
(45) Date of Patent: Feb. 14, 2017

(54) PLASMA ETCHING METHOD

(71) Applicant: TOKYO ELECTRON LIMITED, Tokyo (JP)

(72) Inventors: Ryohei Takeda, Miyagi (JP); Mitsuhiro Tomura, Miyagi (JP); Akinori Kitamura, Miyagi (JP); Shinji Higashitsutsumi, Miyagi (JP); Hiroto Ohtake, Miyagi (JP); Takashi Tsukamoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/399,360

(22) PCT Filed: May 29, 2013

(86) PCT No.: PCT/JP2013/064916
§ 371 (c)(1),
(2) Date: Nov. 6, 2014

(87) PCT Pub. No.: WO2013/180179
PCT Pub. Date: Dec. 5, 2013

(65) Prior Publication Data
US 2015/0099366 A1 Apr. 9, 2015

Related U.S. Application Data

(60) Provisional application No. 61/657,123, filed on Jun. 8, 2012, provisional application No. 61/720,981, filed on Oct. 31, 2012.

(30) Foreign Application Priority Data

Jun. 1, 2012 (JP) .................................. 2012-126000
Oct. 22, 2012 (JP) .................................. 2012-233133

(51) Int. Cl.
*H01L 21/3065* (2006.01)
*H01L 21/67* (2006.01)
(Continued)

(52) U.S. Cl.
CPC ..... *H01L 21/3065* (2013.01); *H01J 37/32091* (2013.01); *H01J 37/32165* (2013.01);
(Continued)

(58) Field of Classification Search
None
See application file for complete search history.

(56) References Cited

U.S. PATENT DOCUMENTS

2004/0023502 A1* 2/2004 Tzou et al. ............... 438/706
2004/0058517 A1* 3/2004 Nallan et al. ............ 438/585
(Continued)

FOREIGN PATENT DOCUMENTS

JP 2007-288119 A 11/2007
JP 2009-170661 A 7/2009
TW 201216331 A1 4/2012

OTHER PUBLICATIONS

H. Xiao, "Introduction to Semiconductor Manufacturing Technology", published by Prentice Hall, 2001, ISBN 0-13-022404-9, pp. 354-356.*
(Continued)

*Primary Examiner* — Jiong-Ping Lu
(74) *Attorney, Agent, or Firm* — Rothwell, Figg, Ernst & Manbeck, P.C.

(57) ABSTRACT

Provided is a plasma etching method capable of favorably forming masks used when etching a multilayer film. This plasma etching method for etching boron-doped amorphous carbon involves using a plasma of a gas mixture comprising a chlorine gas and an oxygen gas, and setting the temperature of a mounting stage (3) to 100° C. or greater.

4 Claims, 11 Drawing Sheets

(51) Int. Cl.
*H01L 21/308* (2006.01)
*H01L 21/311* (2006.01)
*H01L 21/02* (2006.01)
*H01J 37/32* (2006.01)

(52) U.S. Cl.
CPC .. *H01J 37/32192* (2013.01); *H01L 21/02115* (2013.01); *H01L 21/3086* (2013.01); *H01L 21/31116* (2013.01); *H01L 21/31122* (2013.01); *H01L 21/31144* (2013.01); *H01L 21/67069* (2013.01)

(56) References Cited

U.S. PATENT DOCUMENTS

| | | | |
|---|---|---|---|
| 2004/0235299 A1* | 11/2004 | Srivastava | G03F 7/427 438/689 |
| 2010/0081287 A1* | 4/2010 | Honda et al. | 438/719 |
| 2012/0080779 A1* | 4/2012 | Seamons et al. | 257/635 |

OTHER PUBLICATIONS

International Search Report mailed Aug. 13, 2013 in PCT/JP2013/064916.

\* cited by examiner

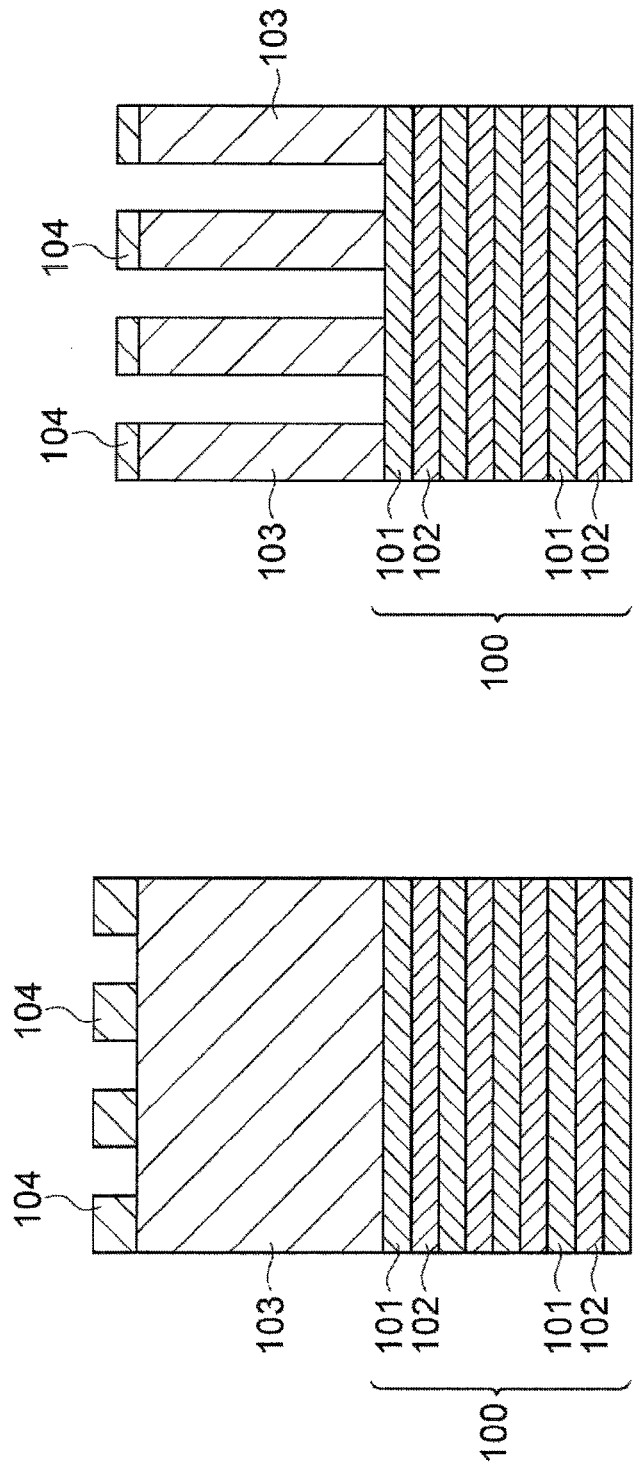

FIG.5

| Temperature[deg.C] | 60 | 100 | 120 | 200 |
|---|---|---|---|---|
| SiON Remain[nm] | 34.1 | 39.7 | 43.7 | 27.8 |
| Depth[nm] | 393.6 | 430.4 | 449.3 | 710.4 |
| TOP CD[nm] | 67.8 | 64.1 | 63.5 | 68.8 |

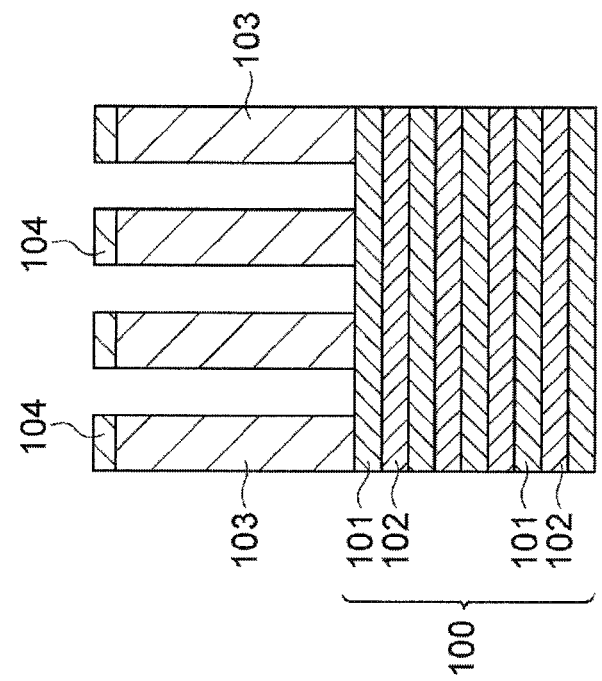
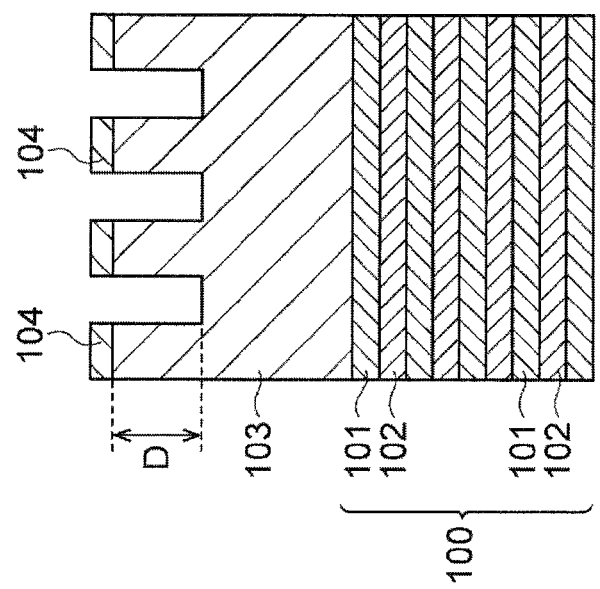

PLASMA ETCHING METHOD

CROSS REFERENCE TO RELATED APPLICATION

This application is a 35 U.S.C. 371 National Phase Entry Application from PCT/JP2013/064916, filed May 29, 2013, which claims priority to and the benefit of U.S. Provisional Application Nos. 61/657,123, filed Jun. 8, 2012 and 61/720,981, filed Oct. 31, 2012 and Japanese Patent Application Nos. 2012-126000, filed Jun. 1, 2012 and 2012-233133, filed Oct. 22, 2012, the disclosures of which are incorporated herein in their entirety by reference.

TECHNICAL FIELD

The present disclosure relates to a plasma etching method.

BACKGROUND ART

There has conventionally been known a technology of etching a processing target by using an amorphous carbon film as an etching mask. For example, Patent Document 1 discloses a method of etching an amorphous carbon film using a resist layer as a mask, transferring a predetermined pattern to the amorphous carbon film, and using the amorphous carbon film as a mask of the processing target. The etching mask of such an amorphous carbon film is used for forming a stepped structure on a multilayered film in which an insulating film and a conductive film are laminated alternately in a manufacturing process of, for example, an NAND type flash memory (see, e.g., Patent Document 2).

PRIOR ART DOCUMENT

Patent Document

Patent Document 1: Japanese Patent Laid-Open Publication No. 2007-288119
Patent Document 2: Japanese Patent Laid-Open Publication No. 2009-170661

DISCLOSURE OF THE INVENTION

Problems to be Solved

However, when a depth or an aspect ratio of an etching hole of a processing target is increased, it is requested that the mask be more plasma-resistant. It is difficult to secure a selection ratio in an amorphous carbon film with a normal thickness. Therefore, it is required to increase the thickness of the amorphous carbon film in order to secure the selection ratio. In this case, it is also required to increase the thickness of a resist layer or an inorganic intermediate layer for transferring a pattern to the amorphous carbon film. However, when the thickness of the resist layer is increased, a problem such as line edge roughness (LER) or line width roughness (LWR) may occur in photolithography of transferring the pattern to the resist layer. Thus, precision of the pattern may be degraded.

Also, an exposure device has a limitation in the depth of focus, and thus it may be impossible to increase the thickness of the resist layer more than needs. Also, since it is difficult to increase the thickness of the resist layer and to greatly improve the selection ratio of the resist layer and the inorganic intermediate layer in etching, the thickness of the inorganic intermediate layer may also not be increased.

Although an improvement in the selection ratio is also requested in etching the amorphous carbon film using the inorganic intermediate layer as a mask, such an improvement is also limited. Therefore, it is difficult to excessively increase the thickness of the amorphous carbon film.

Therefore, as a hard etching mask which can secure a selection ratio, a boron-doped amorphous carbon (BAC) film may be used. However, since the BAC film is a hardly etchable material, it is difficult to etch the BAC film.

The present disclosure has been made to solve the foregoing problems, and an object of the present disclosure is to provide a plasma etching method of etching boron-doped amorphous carbon.

Means to Solve the Problems

An aspect of the present disclosure provides a plasma etching method for etching a boron-doped amorphous carbon using a semiconductor manufacturing apparatus. The semiconductor manufacturing apparatus includes a processing container configured to form a processing space, a mounting stage on which a processing target object is placed, an energy generating source configured to generate energy for plasma excitation, and a gas supply unit configured to supply a processing gas into the processing container. The plasma etching method uses plasma of a mixed gas of chlorine gas and oxygen gas, and sets a temperature of the mounting stage to be 100° C. or more.

When the boron-doped amorphous carbon is etched, the plasma etching method uses the plasma of the mixed gas of chlorine gas and oxygen gas, and sets the temperature of the mounting stage to be 100° C. or more. When the mixed gas of the chlorine gas and the oxygen gas is used as described above, carbon may be volatilized by reaction of oxygen with carbon, and boron reacts with chlorine to produce boron chloride so that the evaporation temperature of boron is decreased. Thus, boron may be volatilized by setting the temperature of the mounting stage to be 100° C. or more. Accordingly, the amorphous carbon containing boron may be satisfactorily etched.

In an exemplary embodiment, the plasma etching method includes at least a first step of initiating etching, and a second step performed after the first step. In the first step, an amount of the oxygen gas supplied from the gas supply unit is set to a first supply amount, and in the second step, the amount of the oxygen gas supplied from the gas supply unit is set to a second supply amount which is smaller than the first supply amount.

At the initial stage of etching, radicals and ions may easily collide with the side wall of the etching hole in a portion of boron-doped amorphous carbon just below a resist layer. Thus, the side wall may be cut out in excess. Accordingly, a difference may occur in dimension between the top and bottom of the etching hole. Therefore, in the first step of initiating etching, the supply amount of oxygen is set to be larger than that of the second step. Accordingly, at the initial state of etching, boron is oxidized by oxygen so that a protective film is formed on the side wall of the etching hole just below the resist layer, thereby suppressing the side wall from being cut out. Therefore, the difference between the top and bottom in dimension may be reduced.

In the second step in the second half etching, the supply amount of the oxygen gas is reduced. Thus, when the etching hole becomes deeper, the outgassing property may be secured. Accordingly, the reduction of the etching rate may be suppressed, and the improvement of the etching rate may be achieved. As a result, the etching time may be reduced.

In an exemplary embodiment, in the first step, a pressure within the processing container is set to be a first pressure, and in the second step, the pressure within the processing container is set to be a second pressure which is higher than the first pressure. In this case, the etching rate may be improved.

In an exemplary embodiment, the temperature of the mounting stage may range from 100° C. to 350° C.

In an exemplary embodiment, the energy generating source includes: a microwave generator configured to generate microwaves; and a high frequency power supply connected to the mounting stage and configured to generate a high frequency bias power. A power of the microwave generator may be set to be in a range of 3000 W to 4000 W, and a power of the high frequency power supply may be set to be in a range of 300 W to 800 W.

In an exemplary embodiment, the microwaves may be irradiated from a radial line slot antenna into the processing container.

In an exemplary embodiment, the energy generating source may include: a first high frequency power supply configured to apply a first high frequency power to any one of an upper electrode and a lower electrode; and a second high frequency power supply configured to apply a second high frequency power to any one of the upper electrode and the lower electrode, the second high frequency power being lower than the first high frequency power. The first high frequency power may be set to be 1000 W or more, and the second high frequency power may be set to be 400 W or more.

Effect of the Invention

According to the present disclosure, boron-doped amorphous carbon may be etched.

BRIEF DESCRIPTION OF THE DRAWINGS

FIGS. 3A and 3B are views illustrating an etching process of a BAC film.

FIG. 5 is a table representing temperatures of a mounting stage and depths of an etching hole.

FIGS. 10A and 10B are views illustrating an etching process of a BAC film.

DETAILED DESCRIPTION TO EXECUTE THE INVENTION

Figure 1:
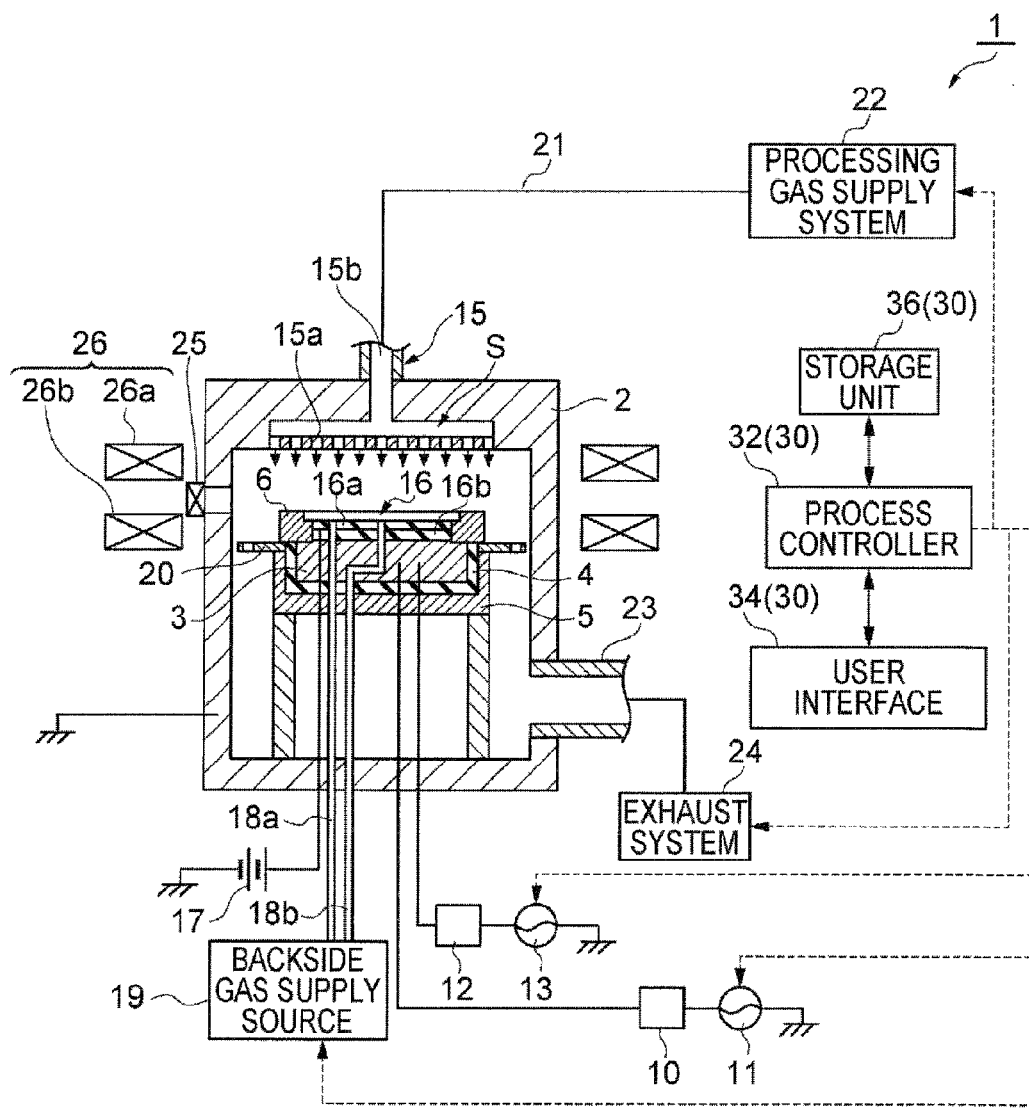
FIG. 1 is a view schematically illustrating a schematic configuration of a plasma processing apparatus used for performing a plasma etching method according to a first exemplary embodiment.

Hereinafter, appropriate exemplary embodiments of the present disclosure will be described in detail with reference to accompanying drawings. In the descriptions of drawings, identical or corresponding elements will be given the same reference numerals, and redundant descriptions thereof will be omitted.

[First Exemplary Embodiment]

FIG. 1 is a view schematically illustrating a schematic configuration of a plasma processing apparatus used for performing a plasma etching method according to a first exemplary embodiment. A plasma processing apparatus (a semiconductor manufacturing apparatus) 1 is configured as a parallel plate type plasma etching apparatus. The plasma processing apparatus 1 includes a processing chamber (processing container) 2 which is airtightly configured to define a processing space, and electrically becomes a ground potential.

The processing chamber 2 is formed in a cylindrical shape and is made of, for example, aluminum having a surface formed with an anodic oxide film. A mounting stage 3 is provided within the processing chamber 2. On the mounting stage 3, a semiconductor wafer W (see FIG. 5) as a substrate to be processed (a processing target object) is substantially horizontally placed. The mounting stage 3 also serves as a lower electrode, and is made of a conductive material such as, for example, aluminum. The mounting stage 3 is supported by a conductive support 5 through an insulating plate 4. An annularly formed focus ring 6 is provided at the outer periphery of the mounting stage 3 to surround the periphery of the semiconductor wafer W. The temperature of the mounting stage 3 may be adjusted.

The mounting stage 3 is connected to a first high frequency power supply (an energy generating source) 11 for plasma generation via a first matching box (a matching device) 10, and a second high frequency power supply (an energy generating source) 13 for bias via a second matching box 12. The first high frequency power supply 11 supplies a first high frequency power (hereinafter, referred to as an "HF power") of a predetermined frequency (e.g., 60 MHz) to the mounting stage 3. Meanwhile, the second high frequency power supply 13 supplies a second high frequency power (hereinafter, referred to as an "LF power") of a predetermined frequency (e.g., 13.56 MHz) which is lower than that of the first high frequency power supply 11 to the mounting stage 3.

A shower head 15 is provided as an upper electrode of a ground potential at the upper portion of the processing chamber 2 to face the mounting stage 3 in parallel to the mounting stage 3. Through this configuration, the shower head 15 and the mounting stage 3 serve as a pair of counter electrodes (an upper electrode and a lower electrode).

An electrostatic chuck 16 is provided on the top surface of the mounting stage 3 to electrostatically attract the semiconductor wafer W. The electrostatic chuck 16 is configured by interposing an electrode 16b between insulators 16a. A DC power supply 17 is connected to the electrode 16b. The electrostatic chuck 16 is configured such that the semiconductor wafer W is attracted to the electrostatic chuck 16 by, for example, Coulomb force when a DC voltage is applied to the electrode 16b from the DC power supply 17.

A refrigerant path (not illustrated) is formed within the mounting stage 3, and a refrigerant is circulated in the refrigerant path to control the temperature. Backside gas supply pipes 18a and 18b are connected to the mounting stage 3 to supply a backside gas (a rear side heat transfer gas) such as, for example, helium gas to the rear surface side of the semiconductor wafer W. Accordingly, in the mounting stage 3, the backside gas is supplied to the rear surface side of the semiconductor wafer W from a backside gas supply source 19.

Meanwhile, the backside gas supply pipe 18a is configured to supply the backside gas to the central portion of the semiconductor wafer W, and the backside gas supply pipe 18b is configured to supply the backside gas to the peripheral portion of the semiconductor wafer W. Through this configuration, the semiconductor wafer W may be controlled to a predetermined temperature. An exhaust ring 20 is provided below and outside the focus ring 6. The exhaust ring 20 is conductive with the processing chamber 2 through the support 5.

A plurality of gas ejecting holes 15a is formed on the bottom surface of the shower head 15 provided to face the mounting stage 3, and a gas introducing portion 15b is formed above the gas ejecting holes 15a. A space S is formed within the shower head 15. A gas supply pipe 21 is connected to the gas introducing portion 15b, and a processing gas supply system (a gas supply unit) 22 is connected to the other end of the gas supply pipe 21 to supply, for example, a plasma etching gas (an etching gas).

The gas supplied from the processing gas supply system 22 reaches the space S within the shower head 15 through the gas supply pipe 21 and the gas introducing portion 15b, and is ejected from the gas ejecting holes 15a toward the semiconductor wafer W.

An exhaust port 23 is formed at the lower portion of the processing chamber 2, and an exhaust system 24 is connected to the exhaust port 23. The inside of the processing chamber 2 may be decompressed to a predetermined vacuum degree by operating a vacuum pump (not illustrated) provided in the exhaust system 24. A gate valve 25 is provided on the side wall of the processing chamber 2 to open and close a carry-in/out port of the semiconductor wafer W.

A ring magnet 26 is disposed around the processing chamber 2. The ring magnet 26 is formed in an annular shape, and arranged concentrically around the processing chamber 2. The ring magnet 26 includes an upper ring magnet 26a and a lower ring magnet 26b disposed below the upper ring magnet 26a, and forms a predetermined magnetic field in a space between the mounting stage 3 and the shower head 15. The ring magnet 26 is rotatable by a rotating unit such as, for example, a motor (not illustrated).

The operation of the plasma processing apparatus 1 configured as described above is generally controlled by a control unit 30. The control unit 30 includes a central processing unit (CPU), and includes a process controller 32 for controlling respective units of the plasma processing apparatus 1, a user interface 34, and a storage unit 36.

The user interface 34 includes, for example, a keyboard by which an operation manager performs an input operation of a command to manage the plasma processing apparatus 1, or a display which visualizes and displays the operation status of the plasma processing apparatus 1.

The storage unit 36 stores recipes in which, for example, control programs (software) configured to implement various processings to be executed in the plasma processing apparatus 1 under the control of the process controller 32, or processing condition data are recorded. As required, any recipe may be called from the storage unit 36 by, for example, a command from the user interface 34 and the process controller 32 may execute the recipe to perform the desired processing in the plasma processing apparatus 1 under the control of the process controller 32.

Hereinafter, descriptions will be made on the sequence of performing plasma etching on a semiconductor wafer W by the plasma processing apparatus 1. First, the gate valve 25 is opened, and the semiconductor wafer W is carried into the processing chamber 2 by, for example, a conveying robot (not illustrated) through a load lock chamber (not illustrated), and placed on the mounting stage 3. Then, the conveying robot is retracted to the outside of the processing chamber 2, and the gate valve 25 is closed. The inside of the processing chamber 2 is exhausted by the vacuum pump of the exhaust system 24 through the exhaust port 23.

After the inside of the processing chamber 2 reaches a predetermined vacuum degree, a predetermined processing gas is introduced into the processing chamber 2 from the processing gas supply system 22, and the inside of the processing chamber 2 is maintained at a processing pressure. In this state, a high frequency power is supplied to the mounting stage 3 from the first high frequency power supply 11 and the second high frequency power supply 13. Here, a predetermined DC voltage is applied to the electrode 16b of the electrostatic chuck 16 from the DC power supply 17, and the semiconductor wafer W is attracted to the electrostatic chuck 16.

When the high frequency power is applied to the mounting stage 3 serving as the lower electrode, an electric field is formed between the shower head 15 as the upper electrode and the mounting stage 3 as the lower electrode. Meanwhile, since the magnetic field is formed by the ring magnet 26 between the shower head 15 serving as the upper electrode and the mounting stage 3 serving as the lower electrode, magnetron discharge occurs due to drift of electrons in the processing space where the semiconductor wafer W is present. By the action of processing gas plasma formed by the magnetron discharge, a predetermined plasma processing is performed on the semiconductor wafer W.

When the predetermined plasma processing is completed, the supply of the high frequency power and the supply of the processing gas are stopped, and the semiconductor wafer W is carried out from the inside of the processing chamber 2 in the reverse sequence to the sequence as described above.

Subsequently, descriptions will be made on an etching method according to the present exemplary embodiment with reference to FIGS. 2A, 2B, 3A and 3B. FIGS. 2A, 2B, 3A and 3B are views illustrating an etching process of a BAC film. Meanwhile, hereinafter, descriptions will be made on a process of etching a BAC film 103 (to be described later) by the etching method according to the present exemplary embodiment.

First, the configuration of the semiconductor wafer W as a processing target will be described. As illustrated in FIGS. 2A, 2B, 3A and 3B, for example, a multilayered film 100 is formed in the semiconductor wafer W. The multilayered film 100 is constituted by a silicon dioxide ($SiO_2$) film 101 as an insulating film and a polysilicon film 102 as a conductive film which are laminated alternately. The multilayered film 100 may include a total of 64 films including, for example, 32 silicon dioxide films 101, and 32 polysilicon films 102.

On the multilayered film 100, a boron-doped amorphous carbon film 103 (hereinafter, referred to as a "BAC film 103") (B: boron) is formed as an etching mask layer. The BAC film 103 is formed by, for example, a chemical vapor deposition (CVD) method. A silicon oxynitride (SiON) film (a resist layer) 104 is formed on the BAC film 103. On the silicon oxynitride film 104, a bottom anti-reflection coating (BARC) film 105 and a photoresist film 106 are sequentially formed. The photoresist film 106 is patterned in a predetermined shape to serve as a mask for etching the silicon oxynitride film 104. Meanwhile, another film may be formed between the multilayered film 100 and the BAC film 103.

Figure 2B:
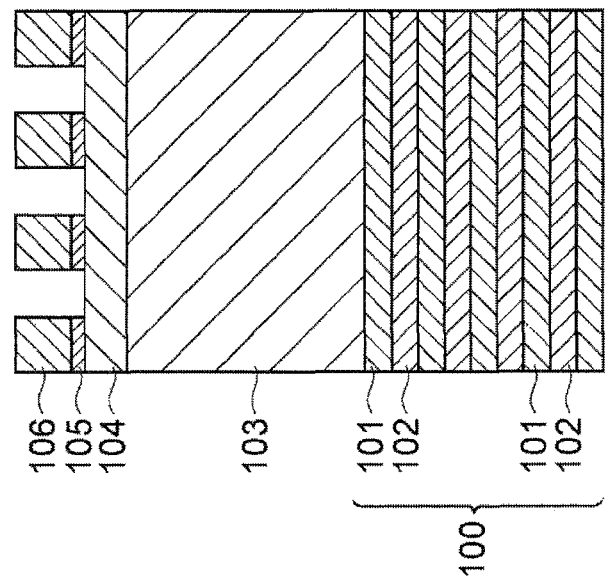
FIGS. 2A and 2B are views illustrating an etching process of a BAC film.
Figure 2A:
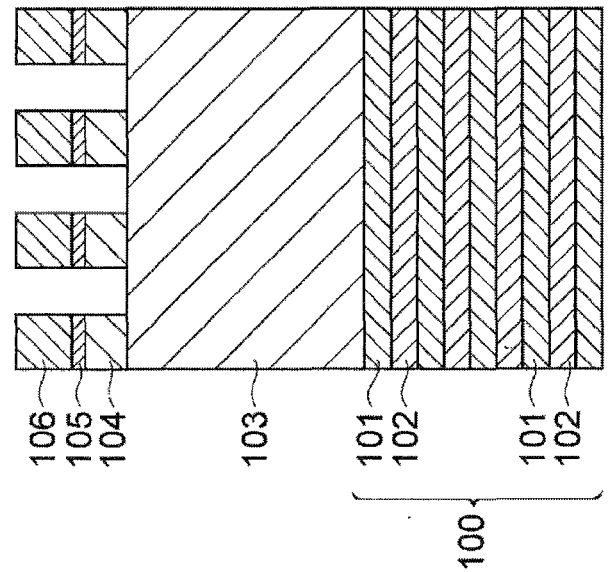

Subsequently, an etching processing of the BAC film 103 will be described. First, as illustrated in FIG. 2A, a plasma etching processing is performed on the silicon oxynitride film 104 by using the photoresist film 106 as a mask to etch the silicon oxynitride film 104 as illustrated in FIG. 2B. Then, as illustrated in FIG. 3A, the BARC film 105 and the photoresist film 106 are removed.

Subsequently, a plasma etching processing is performed on the BAC film 103 by using the silicon oxynitride film 104 as a mask to etch the BAC film 103. Here, in the present exemplary embodiment, plasma of a processing gas including $Cl_2+O_2$ is used. Accordingly, on the BAC film 103, as illustrated in FIG. 3B, a mask pattern is formed in a shape corresponding to the pattern of the photoresist film 106. For example, more specific conditions for the etching processing of the BAC film 103 are as follows.

(Etching of BAC Film)
Processing Gas: $Cl_2/O_2$=123/100 sccm
Pressure: 20 mTorr (2.67 Pa)
Processing Time: 150 sec
High Frequency Power (HF power/LF power): 1200 W/500 W
Mounting Stage Temperature: 200° C.

In the present exemplary embodiment, as the processing gas for the plasma etching on the BAC film 103, a mixed gas of chlorine gas and oxygen gas is used. Since the evaporation temperature of boron at atmospheric pressure is very high (3927° C.), and thus boron is hardly volatilized. Meanwhile, $BCl_3$ (boron trichloride) of a boron-containing compound has an evaporation temperature of 12.5° C. at atmospheric pressure. When boron bound to chlorine has a lowered evaporation temperature and thus is easily volatilized. Also, $CCl_4$ (carbon tetrachloride) obtained by binding carbon with chloride has an evaporation temperature of about 76.8° C. at atmospheric pressure. Thus, amorphous carbon is also easily volatilized when bound to chloride.

Figure 4:
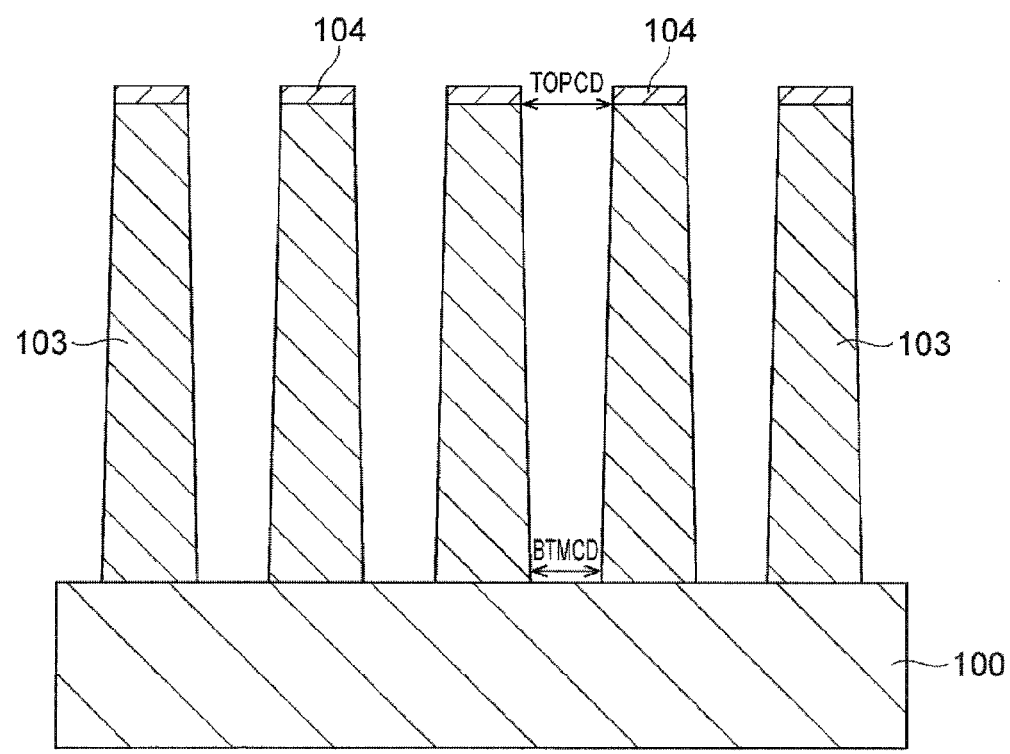
FIG. 4 is a view illustrating a BAC film after etching.

The temperature of the mounting stage 3 is appropriately set according to the amount of boron contained in the BAC film 103, and may be set to be in a range of about 100° C. to 350° C. The temperature of the mounting stage 3 and the depth of the etching hole will be described with reference to FIGS. 4 and 5. FIG. 4 is a view illustrating a BAC film after etching, and FIG. 5 is a table representing the temperatures of the mounting stage and the depths of the etching hole. Meanwhile, FIG. 5 also illustrates a remaining thickness (SiON Remain) of the silicon oxynitride film 104 and a TOPCD (to be described later).

In FIG. 4, a TOPCD indicates a critical dimension (CD) of an etching hole at the opening side, and a BTMCD indicates a CD of the bottom portion of the etching hole. The TOPCD may be 90 nm or less, and the BTMCD may be 60 nm or more.

As illustrated in FIG. 5, when the temperature of the mounting stage 3 is high, the BAC film 103 may be etched deeply while the TOPCD is maintained to be not greater than 90 nm. As described above, it is effective that a chlorine gas-containing gas is used as a processing gas, and the temperature of the mounting stage 3 is set to be 100° C. or more so as to etch the BAC film 103 doped with boron. When the temperature of the mounting stage 3 is set to a high temperature, the pressure is preferably set to a low pressure (e.g., 100 Torr or less).

Figure 6A:
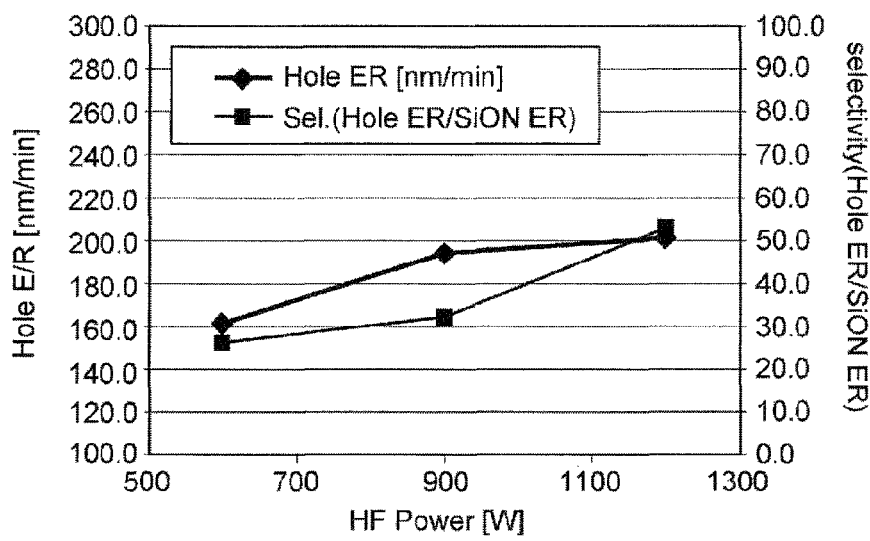
FIG. 6A is a view illustrating a relationship of an HF high frequency power with an etching rate and a selection ratio.
Figure 6B:
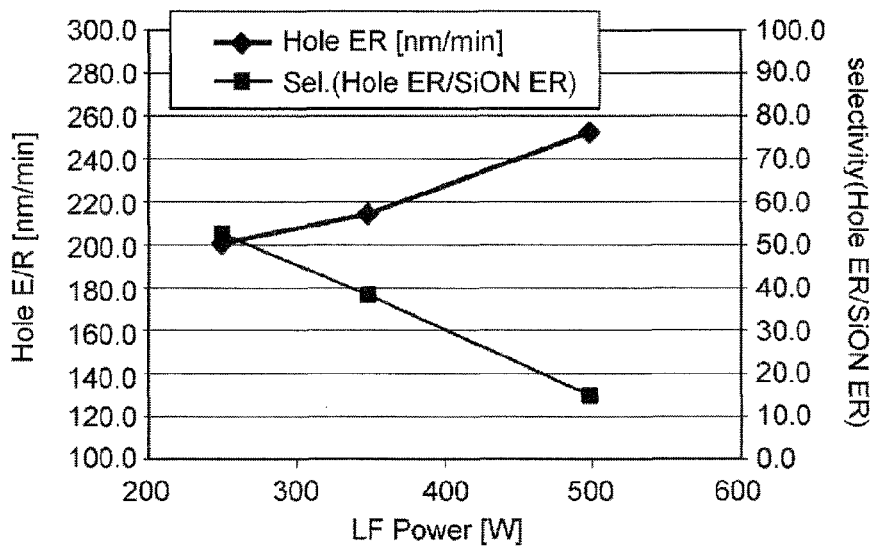
FIG. 6B is a view illustrating a relationship of an LF high frequency power with an etching rate and a selection ratio.

The HF power of the first high frequency power supply 11 and the LF power of the second high frequency power supply 13 are set as follows. FIGS. 6A and 6B are views illustrating a relationship of a high frequency power with an etching rate and a selection ratio. FIG. 6A illustrates a relationship of an HF high frequency power with an etching rate and a selection ratio, and FIG. 6B illustrates a relationship of an LF high frequency power with an etching rate and a selection ratio. In FIGS. 6A and 6B, the horizontal axis indicates a high frequency power (W), and the vertical axis indicates an etching rate (nm/min) and a selection ratio. FIGS. 6A and 6B illustrate results under conditions including a pressure: 10 mTorr, a processing time: 180 sec, a high frequency power (HF power /LF power): 1200 W/250 W, and a mounting stage temperature: 200° C.

As illustrated in FIG. 6A, when the HF power is increased, the etching rate is increased up to a predetermined extent and a higher etching rate is not obtained, while the selection ratio of the silicon oxynitride film 104 and the BAC film 103 is improved. Accordingly, it is effective that the HF power is high in the process condition. As illustrated in FIG. 6B, when the LF power is increased, the etching rate is linearly increased while the selection ratio of the silicon oxynitride film 104 and the BAC film 103 is decreased.

Figure 7A:
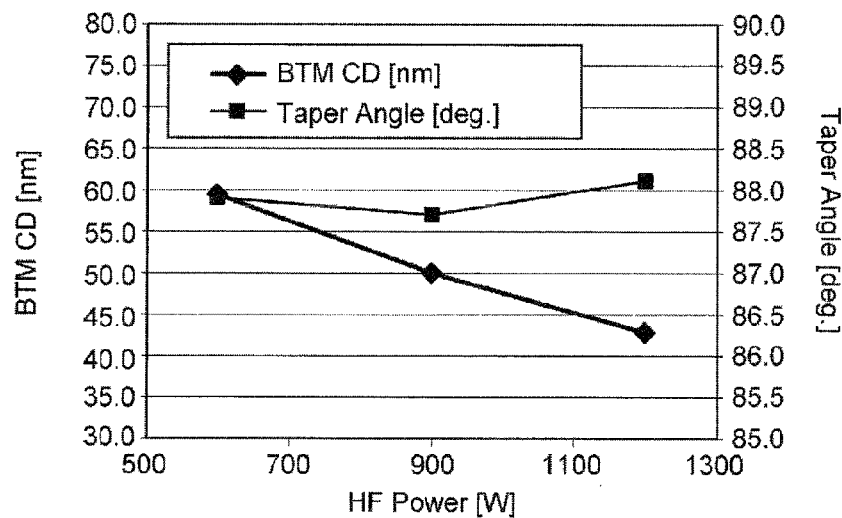
FIG. 7A illustrates a relationship of an HF high frequency power with a critical dimension of a bottom portion of an etching hole and a taper angle.
Figure 7B:
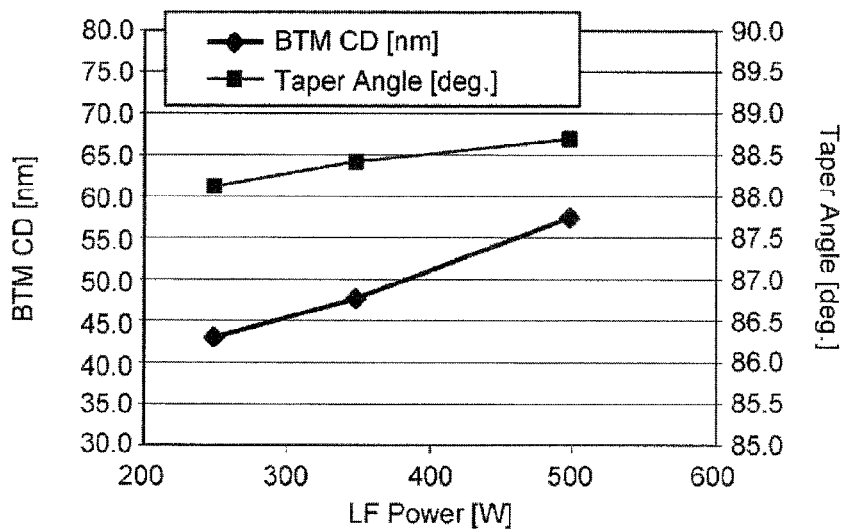
FIG. 7B is a view illustrating a relationship of an LF high frequency power with a critical dimension of a bottom portion of an etching hole and a taper angle.

FIGS. 7A and 7B are views illustrating a relationship of a high frequency power with a critical dimension of a bottom portion of an etching hole and a taper angle. FIG. 7A illustrates a relationship of an HF high frequency power with a critical dimension of a bottom portion of an etching hole and a taper angle, and FIG. 7B illustrates a relationship of an LF high frequency power with a critical dimension of a bottom portion of an etching hole and a taper angle. In FIGS. 7A and 7B, the horizontal axis indicates a high frequency power (W), and the vertical axis indicates a BTMCD (nm) and a taper angle (deg.). The process conditions for the results illustrated in FIGS. 7A and 7B are the same as those in FIGS. 6A and 6B.

As illustrated in FIG. 7A, when the HF power is increased, the taper angle is not significantly changed while the BTMCD is decreased. As illustrated in FIG. 7B, when the LF power is increased, the BTMCD is increased, the taper angle is also increased, and the verticality is improved due to increase of the amount of drawn ions. Meanwhile, when the LF power is further increased, the BTMCD may be increased up to a suitable value (60 nm) or more. As described above, when the temperature of the mounting stage 3 is increased, the TOPCD is increased. Meanwhile, when the LF power is increased, a difference between the TOPCD and the BTMCD is decreased. Thus, verticality may be obtained.

As illustrated in FIGS. 6A, 6B, 7A and 7B, when the HF power is increased, the etching rate may be improved, the selection ratio may be secured, but verticality of an etching hole is not suitably obtained because it is difficult to secure the BTMCD. Therefore, the BTMCD may be secured and the taper angle may be improved by increasing the LF power. Here, when the LF power is increased, the selection ratio may be lowered. However, the selection ratio may be secured by increasing the HF power. Thus, an etching hole with high verticality may be formed under suitable conditions. According to the results as described above, in the present exemplary embodiment, the high frequency power is set to 1200 W/500 W (HF power /LF power). Meanwhile, each of the HF power and the LF power may be suitably set according to the temperature of the mounting stage 3, the pressure, the amount of boron contained in the BAC film 103.

As described above, in the present exemplary embodiment, when the BAC film 103 is subjected to plasma etching, the BAC film 103, which is a hardly etchable material, may be suitably etched by using the chlorine gas-containing processing gas and setting the temperature of the mounting stage 3 to be high. Further, it is possible to secure the etching rate and selection ratio and to obtain the verticality by setting the HF power and the LF power to be high.

As descried above, in the present exemplary embodiment, in etching the BAC film 103 used as a mask for etching the multilayered film 100, the temperature of the mounting stage 3 is set to be 100° C. or more, and $Cl_2+O_2$ is used as a processing gas to be supplied from the processing gas supply system 22. Also, in the present exemplary embodiment, the HF power of the first high frequency power supply 11 and the LF power of the second high frequency power supply 13 are set to be high. Here, the high HF power and the high LF power are higher than a power to be applied when an amorphous carbon film not doped with boron is etched.

As described above, in the present exemplary embodiment, due to plasma of a mixed gas of chlorine gas and oxygen gas, chlorine reacts with boron and the evaporation temperature of boron is decreased. Thus, boron may be volatilized by setting the temperature of the mounting stage 3 to be 100° C. or more. Accordingly, the amorphous carbon film 103 containing boron may be satisfactorily etched. In the present exemplary embodiment, the HF power and the LF power may be set to be higher than the power to be applied when amorphous carbon not doped with boron is etched so that selection ratio may be secured and etching may be promoted to secure an etching rate, and also verticality may be improved. Accordingly, each of a TOPCD and a BTMCD may be set to a predetermined value or less, and the BAC film 103 which is a hardly etchable material may be etched.

Furthermore, since the BAC film 103 may be etched with high precision, the mask used for etching the multilayered film 100 may be satisfactorily formed.

[Second Exemplary Embodiment]

Figure 8:
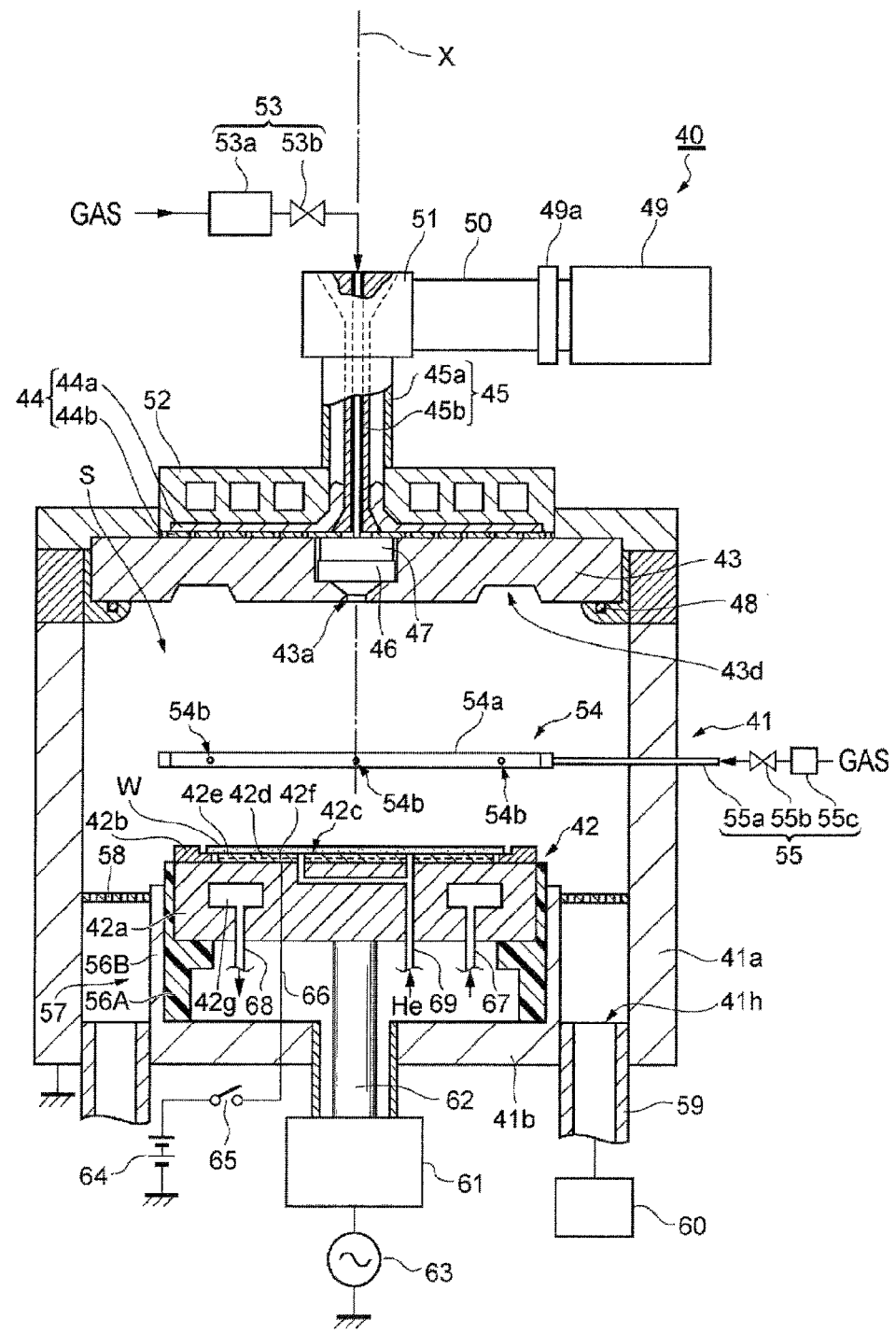
FIG. 8 is a view schematically illustrating a schematic configuration of a plasma processing apparatus used for performing a plasma etching method according to a second exemplary embodiment.

Subsequently, a second exemplary embodiment will be described. FIG. 8 is a view schematically illustrating a schematic configuration of a plasma processing apparatus used for performing a plasma etching method according to a second exemplary embodiment. A plasma processing apparatus 40 illustrated in FIG. 8 includes a processing chamber (processing container) 41, a mounting stage 42, a dielectric member 43, an antenna 44, a coaxial waveguide 45, an injector 46, and a piping member 47.

The processing chamber 41 forms a processing space S where a plasma processing is performed on a processing target substrate W. The processing chamber 41 includes a side wall 41a and a bottom portion 41b. The side wall 41a has a substantially cylindrical shape which extends in an axis X direction. The bottom portion 41b is formed at a lower end of the side wall 41a. An exhaust port 41h for exhaust is formed in the bottom portion 41b. The upper end of the side wall 41a is opened.

The top side opening of the side wall 41a is closed by the dielectric member 43 also called a dielectric window. An O ring 48 may be interposed between the dielectric member 43 and the top portion of the side wall 41a. The processing chamber 41 is more securely sealed by the O ring 48.

The plasma processing apparatus 40 further includes a microwave generator 49. The microwave generator 49 generates microwaves having a frequency of, for example, 2.45 GHz. The microwave generator 49 includes a tuner 49a. The microwave generator 49 is connected to the top of the coaxial waveguide 45 through a waveguide 50 and a mode converter 51.

The coaxial waveguide 45 extends along the axis X. The coaxial waveguide 45 includes an outer conductor 45a and an inner conductor 45b. The outer conductor 45a is formed in a cylindrical shape which extends in the axis X direction. The lower end of the outer conductor 45a may be electrically connected to the top of a cooling jacket 52. The inner conductor 45b is provided inside the outer conductor 45a. The inner conductor 45b extends along the axis X. The lower end of the inner conductor 45b is connected to a slot plate 44b of the antenna 44.

The antenna 44 includes a dielectric plate 44a and the slot plate 44b. The dielectric plate 44a is formed substantially in a disk shape. The dielectric plate 44a may be made of, for example, quartz or alumina. The dielectric plate 44a is sandwiched between the slot plate 44b and the bottom surface of the cooling jacket 52. Therefore, the antenna 44 may be constituted by the dielectric plate 44a, the slot plate 44b, and the bottom surface of the cooling jacket 52.

Figure 9:
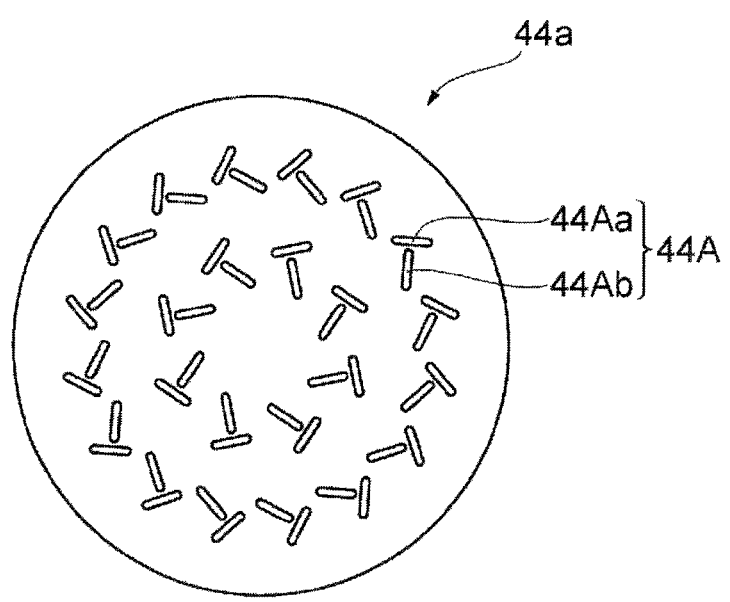
FIG. 9 is a plan view illustrating an example of a slot plate illustrated in FIG. 8.

The slot plate 44b is a metallic plate formed substantially in a disk shape and is formed with a plurality of slots. In an exemplary embodiment, the antenna 44 may be a radial line slot antenna (RLSA). FIG. 9 is a plan view illustrating an example of the slot plate illustrated in FIG. 8. A plurality of slot pairs 44A is formed in the slot plate 44b. The plurality of slot pairs 44A is formed at predetermined intervals in a radial direction and also arranged at predetermined intervals in a circumferential direction. Each of the plurality of slot pairs 44A includes two slot holes 44Aa and 44Ab. The slot holes 44Aa and 44Ab extend in intersecting or perpendicular directions. Microwaves generated by the microwave generator 49 are propagated to the dielectric plate 44a through the coaxial waveguide 45 and introduced to the dielectric member 43 from the slot pairs 44A of the slot plate 44b.

The dielectric member 43 is formed substantially in a disk shape, and made of, for example, quartz or alumina. The dielectric member 43 is provided to face the mounting stage 42 in the X direction, and is provided just below the slot plate 44b. The microwaves are introduced from the antenna 44 into the processing space S through the dielectric member 43. Accordingly, an electric field is generated just below the dielectric member 43, and plasma is generated within the processing space S. As described above, according to the plasma processing apparatus 40, plasma may be generated by using microwaves without applying a magnetic field.

The bottom surface of the dielectric member 43 defines a concave portion 43d. The concave portion 43d is formed annularly around the axis X and has a tapered shape. The concave portion 43d is formed to promote generation of standing waves by the introduced microwaves, and contributes efficient generation of plasma by the microwaves.

In the plasma processing apparatus 40, the inner conductor 45b has a cylindrical shape extending along the axis X. The piping member 47 is inserted into the inner conductor 45b. A gas supply system 53 is connected to one end of the piping member 47. The gas supply system 53 is constituted by a flow rate controller 53a such as a mass flow controller and an opening/closing valve 53b. In an exemplary embodiment, a processing gas from the gas supply system 53 is supplied into the injector 46 through the piping member 47. The processing gas from the piping member 47 is supplied into the processing space S through a through hole 43a which is foamed in the injector 46 and the dielectric member 43.

In addition, the plasma processing apparatus 40 further includes a separate gas supply unit 54. The gas supply unit 54 includes a gas pipe 54a. The gas pipe 54a extends annularly around the axis X between the dielectric member 43 and the mounting stage 42. In the gas pipe 54a, a plurality of gas ejecting holes 54b which ejects a gas in a direction toward the axis X is formed. The gas supply unit 54 is connected to a gas supply system 55.

The gas supply system 55 includes a gas pipe 55a, an opening/closing valve 55b, and a flow rate controller 55c such as a mass flow controller. The processing gas is supplied to the gas pipe 54a of the gas supply unit 54 through the flow rate controller 55c, the opening/closing valve 55b and the gas pipe 55a. Meanwhile, the gas pipe 55a penetrates the side wall 41a of the processing chamber 41. The gas pipe 54a of the gas supply unit 54 is supported by the side wall 41a through the gas pipe 55a.

The mounting stage 42 is provided to leave the processing space S between the antenna 44 and the mounting stage 42. The processing target substrate W is placed on the mounting stage 42. The temperature of the mounting stage 42 may be adjusted. In an exemplary embodiment, the mounting stage 42 includes a stand 42a, a focus ring 42b, and an electrostatic chuck 42c.

The stand 42a is supported by a tubular support 56A. The tubular support 56A is formed of an insulating material and extends upwardly from the bottom portion 41b in a vertical direction. Further, a conductive tubular support 56B is provided at an outer periphery of the tubular support 56A. The tubular support 56B extends upwardly from the bottom portion 41b of the processing chamber 41 in the vertical direction along the outer periphery of the tubular support 56A. An annular exhaust passage 57 is formed between the tubular support 56B and the side wall 41a.

An annular baffle plate 58 which has a plurality of through holes formed therein is attached to an upper portion of the exhaust passage 57. An exhausting device 60 is connected to a lower portion of the exhaust port 41h through an exhaust pipe 59. The exhausting device 60 includes a vacuum pump such as, for example, a turbo molecular pump. The processing space S within the processing chamber 41 may be decompressed to a desired degree of vacuum by the exhausting device 60.

The stand 42a also serves as a high frequency electrode. A high frequency power supply 63 for RF bias is electrically connected to the stand 42a through a matching unit 61 and a power feeding rod 62. The high frequency power supply 63 outputs a high frequency power (high frequency bias power) of a predetermined frequency which is suitable for controlling energy of ions to be attracted to the processing target substrate W, for example, 13.65 MHz with a predetermined power. The matching unit 61 accommodates a matching device which matches impedance at the high frequency power supply 63 side with impedance at a load side, mainly such as an electrode, plasma, and the processing chamber 41. A self-bias generating blocking capacitor is included in the matching device.

The electrostatic chuck 42c is provided on a top surface of the stand 42a. The electrostatic chuck 42c maintains the processing target substrate W by an electrostatic attraction force. The focus ring 42b which annularly encloses the periphery of the processing target substrate W is provided outside the electrostatic chuck 42c in a radial direction. The electrostatic chuck 42c includes an electrode 42d, an insulating film 42e, and an insulating film 42f. The electrode 42d is configured by a conductive film and provided between the insulating film 42e and the insulating film 42f. A high voltage DC power supply 64 is electrically connected to the electrode 42d through a switch 65 and a coated wire 66. The electrostatic chuck 42c may attract and maintain the processing target substrate W by a coulomb force which is generated by a DC voltage applied from the DC power supply 64.

An annular coolant chamber 42g extending circumferentially is formed within the stand 42a. A coolant at a predetermined temperature, for example, cooling water, is circularly supplied to the coolant chamber 42g from a chiller unit (not illustrated) through pipes 67 and 68. A heat transfer gas of the electrostatic chuck 42c, for example, He gas is supplied to a gap between the top surface of the electrostatic chuck 42c and a rear surface of the processing target substrate W through a gas supply pipe 69 according to the temperature of the coolant.

Subsequently, descriptions will be made on an etching processing of the BAC film 103 by the plasma processing apparatus 40 with reference to FIGS. 2A, 2B, 10A and 10B. FIGS. 10A and 10B are views illustrating an etching process of a BAC film. In the present exemplary embodiment, the thickness of the BAC film 103 is set to, for example, 1300 nm, and the thickness of the silicon oxynitride film 104 is set to, for example, 130 nm. First, in the plasma processing apparatus 40, like in the first exemplary embodiment, as illustrated in FIG. 2A, a plasma etching processing is performed on the silicon oxynitride film 104 by using the photoresist film 106 as a mask to etch the silicon oxynitride film 104 as illustrated in FIG. 2B. Then, as illustrated in FIG. 10A, the BARC film 105 and the photoresist film 106 are removed.

Subsequently, in the plasma processing apparatus 40, a plasma etching processing is performed on the BAC film 103 by using the silicon oxynitride film 104 as a mask to etch the BAC film 103. Here, in the present exemplary embodiment, plasma of a processing gas including chlorine gas and oxygen gas is used. In the etching of the BAC film 103 by the plasma processing apparatus 40, the etching processing is performed by a plurality of divided steps. In the present exemplary embodiment, the etching processing is performed by a first step of initiating the etching, and a second step performed after the first step. In the first step and the second step, the supply amount of oxygen gas in the processing gas, and the pressure within the processing chamber 41 are changed. For example, the processing conditions of the first step and the second step are as follows.

(First Step)
Processing gas: $Cl_2/O_2$=247/350 sccm
Pressure: 15 mTorr (1.99 Pa)
Processing time: 60 sec
High frequency power (MW power/RF power): 4000 W/300 W
Mounting stage temperature: 220° C.
(Second Step)
Processing gas: $Cl_2/O_2$=247/300 sccm
Pressure: 60 mTorr (7.99 Pa)
Processing time: 120 sec
High frequency power (MW power/RF power): 4000 W/400 W
Mounting stage temperature: 220° C.
As illustrated in FIG. 10A, in the first step of initiating the etching of the BAC film 103, the oxygen gas of the processing gas is supplied in a first supply amount (e.g., 350 sccm) to etch the BAC film 103 for a predetermined time (e.g., 60 sec). Then, as illustrated in FIG. 10B, after the BAC film 103 is etched for the predetermined time, in the second step, the oxygen gas is supplied in a second supply amount (e.g., 300 sccm) which is smaller than the first supply amount to etch the BAC film 103.

In the first step, the pressure (processing pressure) within the processing chamber 41 is set to a first pressure (e.g., 15 mTorr) as described above, and in the second step, the pressure within the processing chamber 41 is set to a second pressure (e.g., 60 mTorr) which is higher than that of the first step. In the present exemplary embodiment, the pressure within the processing chamber 41 is set to be in a range of, for example, about 15 mTorr to 70 mTorr.

In the present exemplary embodiment, the MW power of the microwave generator 49 and the RF power of the high frequency power supply 63 are set as follows. When the value of the MW power of the microwave generator 49 is increased, the etching rate is increased, and the selection ratio of the silicon oxynitride film 104 and the BAC film 103 is improved. Therefore, as a process condition, it is effective that the MW power is high. When the value of the RF power of the high frequency power supply 63 is increased, the etching rate is increased due to an increase of the amount of drawn ions while the selection ratio of the silicon oxynitride film 104 and the BAC film 103 is decreased. Accordingly, as a process condition, it is effective that the RF power is low. Based on these results, the MW power of the microwave generator 49 preferably ranges from about 3000 W to 4000 W, and the RF power of the high frequency power supply 63 may range from about 300 W to 800 W, and preferably from about 300 W to 500 W.

The temperature of the mounting stage 42 is suitably set according to the amount of boron contained in the BAC film 103, and may be in a range of, for example, about 100° C. to 350° C., and preferably 200° C. or more.

When the etching was performed under the above described conditions, the central portion of a semiconductor wafer W had the following values.

TOPCD: 75 nm
BTMCD: 49 nm
ΔCD: 26 nm

The remaining silicon oxynitride film 104 serving as a resist layer was 115 nm. The edge portion of the semiconductor wafer W has the following values.

TOPCD: 81 nm
BTMCD: 46 nm
ΔCD: 25 nm

The remaining silicon oxynitride film 104 was 121 nm. In the present exemplary embodiment, the selection ratio of the BAC film 103 and the silicon oxynitride film 104 may be secured by the etching processing of two steps under the above described conditions.

As described above, in the present exemplary embodiment, boron reacts with chlorine by plasma of a mixed gas of chlorine gas and oxygen gas to produce boron chloride, and the evaporation temperature of boron is decreased. Thus, boron may be volatilized by setting the temperature of the mounting stage 42 to be 100° C. or more. Accordingly, the amorphous carbon film 103 containing boron may be satisfactorily etched.

In the plasma processing apparatus 40 provided with a radial line slot antenna as the antenna 44, the plasma etching processing is performed by the first step and the second step. In the first step and the second step, the supply amount of the oxygen gas is changed, and in the second step, the supply amount of the oxygen gas is decreased as compared to that in the first step. That is, in the first step, the supply amount of the oxygen gas is increased as compared to that in the second step.

Descriptions will be made on the acting effect of the supply amount of the oxygen gas by comparing the results under conditions in Comparative Example 1 to the results under the above described conditions of the present exemplary embodiment. In the conditions in Comparative Example 1, the processing is performed by a single step. The conditions in Comparative Example 1 are as follows.

COMPARATIVE EXAMPLE 1

Processing gas: $Cl_2/O_2$=247/300 sccm
Pressure: 15 mTorr (1.99 Pa)
Processing time: 120 sec
High frequency power (MW power/RF power): 4000 W/300 W When the etching was performed under the above described conditions in Comparative Example 1, it was confirmed that a side wall of an etching hole of the BAC film 103 just below the silicon oxynitride film 104 was cut out. At the initiation of the etching, since the etching hole is shallow, radicals and ions may easily collide with the side wall of the BAC film 103 just below the silicon oxynitride film 104. Therefore, the side wall of the BAC film 103 just below the silicon oxynitride film 104 may be cut out or collapsed. Accordingly, in the conditions of Comparative Example 1, a difference between a TOPCD and a BTMCD is increased so that it is difficult to secure the verticality of the etching hole.

In the present exemplary embodiment, in the first step of initiating the etching, the supply amount of the oxygen gas is set to be higher than that of the second step, for example, 350 sccm (>300 sccm) so that boron of the BAC film 103 is oxidized by oxygen gas. Accordingly, a protective film is formed on the side wall of the etching hole of the BAC film 103 just below the silicon oxynitride film 104. Therefore, in the present exemplary embodiment, the side wall of the BAC film 103 just below the silicon oxynitride film 104 is protected by the protective film, thereby suppressing the side wall from being cut out. Accordingly, in the present exemplary embodiment, a difference between a TOPCD and a BTMCD may be decreased. As a result, the verticality of the etching hole may be improved.

In the present exemplary embodiment, in the second step, the supply amount of the oxygen gas is decreased as compared to that in the first step. Descriptions will be made on the acting effect of reduction of the oxygen gas in the second step by comparing the results of Comparative Example 2 to the results of Example. In the conditions in Comparative Example 2, the processing is performed by a single step.

COMPARATIVE EXAMPLE 2

Processing gas: $Cl_2/O_2$=247/350 sccm
Pressure: 15 mTorr (1.99 Pa)
Processing time: 180 sec
High frequency power (MW power/RF power): 4000 W/300 W

EXAMPLE

First Step
Processing gas: $Cl_2/O_2$=247/350 sccm

Pressure: 15 mTorr (1.99 Pa)
Processing time: 60 sec
High frequency power (MW power/RF power): 4000 W/300 W
Second Step
Processing gas: $Cl_2/O_2$=247/210 sccm
Pressure: 15 mTorr (7.99 Pa)
Processing time: 180 sec
High frequency power (MW power/RF power): 4000 W/300 W When the etching was performed under the above described conditions of Comparative Example 2 (processing time: 60 sec), the central portion of a semiconductor wafer W had the following values,
TOPCD: 81 nm
BTMCD: 61 nm
ΔCD: 25 nm, and
the edge portion of the semiconductor wafer W had the following values.
TOPCD: 81 nm
BTMCD: 63 nm
ΔCD: 18 nm When the etching was performed for 180 sec, the central portion of the semiconductor wafer W had the following values,
TOPCD: 87 nm
BTMCD: 22 nm
ΔCD: 55 nm, and
the edge portion of the semiconductor wafer W had the following values.
TOPCD: 77 nm
BTMCD: 0 nm
ΔCD: 77 nm In this manner, in the single processing without changing the supply amount of the oxygen gas, etching did not proceed any more, and the difference of ΔCD became prominent. Especially, at the edge portion of the semiconductor wafer W, the etching was stopped.

Figure 11:
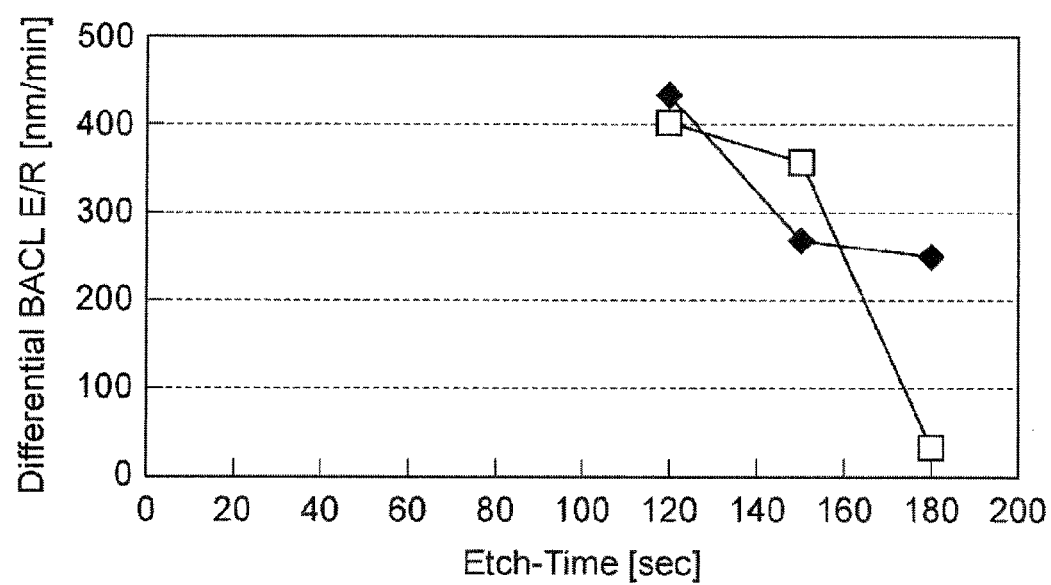
FIG. 11 is a graph illustrating a relationship between an etching time and an etching rate in Comparative Example.

FIG. 11 is a graph illustrating a relationship between an etching time and an etching rate in Comparative Example. In FIG. 11, the horizontal axis denotes an etching time (Etch Time) [sec], and the vertical axis denotes an etching rate (Differential BACL E/R) [nm/min] In FIG. 11, "■" indicates the results at the central portion of a semiconductor wafer W, and "□" indicates the results at the edge portion of the semiconductor wafer W. As illustrated in FIG. 11, under the conditions of Comparative Example 2, the etching rate was lowered with the elapse of time for the etching processing. This is because when the etching hole becomes deeper, gas accumulation occurs in the etching hole, and the progress of the etching is prevented by a microloading effect which causes a process to be varied according to an aspect ratio.

In Example according to the present exemplary embodiment, the supply amount of oxygen gas in the first step is set to 350 sccm, and the supply amount of oxygen gas in the second step is set to 210 sccm. When the etching was performed under the above described conditions of Example, in the first step, the same results as those in Comparative Example 2 were obtained, and in the second step, the central portion of the semiconductor wafer W had the following values,
TOPCD: 73 nm
BTMCD: 85 nm
ΔCD: −12 nm, and
the edge portion of the semiconductor wafer W had the following values.
TOPCD: 77 nm
BTMCD: 57 nm
ΔCD: 20 nm In this manner, in the present exemplary embodiment, in the second step, the supply amount of the oxygen gas is reduced so that the outgassing property in the etching hole is improved to suppress gas accumulation from occurring in the etching hole. Accordingly, in the present exemplary embodiment, the improvement of the etching rate may be achieved and the verticality of the etching hole may be improved.

In the present exemplary embodiment, in the etching processing, the pressure in the second step is set to be higher than a pressure in the first step. In general, in the etching processing, when the pressure is increased, linearity of ions may be inhibited so that the etching rate may be lowered. In the present exemplary embodiment, since the plasma processing apparatus 40 is provided with the radial line slot antenna as the antenna 44, the plasma density is high (e.g., $1\times10^{11}$ $cm^3$), and the etching processing is performed mainly by radicals. Therefore, in the present exemplary embodiment, even when the pressure in the second step is set to be higher than that in the first step, the improvement of the etching rate may be achieved due to the high plasma density so that the etching may be satisfactorily performed.

Specifically, the results of an etching processing under the following conditions will be described.
(First Step)
Processing gas: $Cl_2/O_2$=247/350 sccm
Pressure: 15 mTorr (1.99 Pa)
Processing time: 120 sec
High frequency power (MW power/RF power): 4000 W/300 W
Mounting stage temperature: 220° C.
(Second Step)
Processing gas: $Cl_2/O_2$=247/300 sccm
Pressure: 60 mTorr (7.99 Pa)
Processing time: 120 sec
High frequency power (MW power/RF power): 4000 W/400 W
Mounting stage temperature: 220° C.

When the etching was performed under the above described conditions, the etching rate in the first step was 432 nm/min, and the etching rate in the second step was 567 nm/min. Accordingly, in the present exemplary embodiment, the improvement of the etching rate in the second half etching may be achieved by reducing the supply amount of the oxygen gas in the second step and increasing the pressure within the processing chamber 41.

The present disclosure is not limited to the above described exemplary embodiment. For example, the plasma processing apparatus is not limited to the parallel plate-type lower two-frequency application apparatus illustrated in FIG. 1, but various kinds of plasma processing apparatuses such as, for example, a plasma processing apparatus configured to apply a high frequency wave to each of an upper electrode and a lower electrode may be used.

In the above described exemplary embodiment, as an example, the BAC film 103 is used as a mask for etching the multilayered film 100 including the silicon dioxide film 101 as an insulating film and the polysilicon film 102 as a conductive film which are laminated alternately. However, the BAC film 103 may be used as a mask for etching an etching target film of, for example, Si or Ox.

In the first exemplary embodiment, the etching processing may be performed by a first step of initiating the etching, and a second step performed after the first step. In the first step and the second step, the supply amount of oxygen gas in the processing gas is changed. Specifically, in the first step of initiating the etching, the supply amount of the oxygen gas is set to a first supply amount, and in the second step, the supply amount of the oxygen gas is set to a second supply amount which is smaller than the first supply amount.

In the first exemplary embodiment, the etching processing may be performed by at least two steps. Here, in the first step and the second step, the pressure within the processing chamber 2 may be changed.

DESCRIPTION OF SYMBOL 1, 40: plasma processing apparatus (semiconductor manufacturing apparatus)
2, 41: processing chamber (processing container)
3, 42: mounting stage
11: first high frequency power supply (energy generating source)
13: second high frequency power supply (energy generating source)
22: processing gas supply system (gas supply unit)
49: microwave generator (energy generating source)
55: gas supply system (gas supply unit)
63: high frequency power supply (energy generating source)
103: BAC film

What is claimed is:

1. A plasma etching method for etching a boron-doped amorphous carbon film using a semiconductor manufacturing apparatus,
   wherein the semiconductor manufacturing apparatus includes a processing container configured to form a processing space, a mounting stage on which a substrate formed with the boron-doped carbon film is placed, an energy generating source configured to generate energy for plasma excitation, and a gas supply unit configured to supply a processing gas into the processing container,
   wherein the plasma etching method comprises:
   supplying a mixed gas of chlorine and oxygen gas from the gas supply unit to the processing space of the processing container where the substrate formed with the boron-doped carbon film is mounted on the mounting stage;
   generating plasma of the mixed gas of chlorine gas and oxygen gas in the processing space of the processing container by the energy generating source in order to generate a boron trichloride and a carbon tetrachloride each having a lower vaporization pressure temperature than boron of the boron-doped carbon film; and
   maintaining a temperature of the mounting stage in a range of about 100° C. to 350° C. while the plasma is being generated so that the boron trichloride and the carbon tetrachloride are volatilized in order to etch the boron-doped amorphous carbon film,
   wherein the etching of the boron-doped amorphous carbon film includes at least a first step of initiating etching, and a second step performed after the first step,
   in the first step, an amount of the oxygen gas supplied from the gas supply unit is set to a first supply amount, and a pressure within the processing container is set to a first pressure, and
   in the second step, the amount of the oxygen gas supplied from the gas supply unit is set to a second supply amount which is smaller than the first supply amount, and the pressure within the processing container is set to a second pressure which is higher than the first pressure.

2. The plasma etching method of claim 1, wherein the energy generating source includes:
   a microwave generator configured to generate microwaves; and
   a power supply connected to the mounting stage and configured to generate a bias power,
   wherein a power of the microwave generator is set to be in a range of 3000 W to 4000 W, and
   a power of the power supply is set to be in a range of 300 W to 800 W.

3. The plasma etching method of claim 2, wherein the microwaves are irradiated from a radial line slot antenna into the processing container.

4. The plasma etching method of claim 1, wherein the energy generating source includes:
   a first power supply configured to apply a first power to any one of an upper electrode and a lower electrode; and
   a second power supply configured to apply a second power to any one of the upper electrode and the lower electrode, the second power being lower than the first power,
   wherein the first power is set to be 1000 W or more, and the second power is set to be 400 W or more.

* * * * *